(12) United States Patent
Biernot et al.

(10) Patent No.: US 11,530,492 B2
(45) Date of Patent: Dec. 20, 2022

(54) INSERT FOR HOT ISOSTATIC PRESSING TREATMENT

(71) Applicants: ROLLS-ROYCE plc, London (GB); ROLLS-ROYCE DEUTSCHLAND LTD & CO KG, Blankenfelde-Mahlow (DE)

(72) Inventors: Felix Biernot, Frankfurt (DE); Toma D Nikolov, Berlin (DE); Priyesh R Patel, Solihull (GB); Justin P M Tsang, Derby (GB)

(73) Assignees: ROLLS-ROYCE plc, London (GB); ROLLS-ROYCE DEUTSCHLAND LTD & CO KG, Blankenfelde-Mahlow (DE)

( * ) Notice: Subject to any disclaimer, the term of this patent is extended or adjusted under 35 U.S.C. 154(b) by 459 days.

(21) Appl. No.: 16/741,870

(22) Filed: Jan. 14, 2020

(65) Prior Publication Data
US 2020/0248335 A1 Aug. 6, 2020

(30) Foreign Application Priority Data
Feb. 6, 2019 (GB) ..................... 1901610

(51) Int. Cl.
*C30B 35/00* (2006.01)
*C30B 33/02* (2006.01)
(Continued)

(52) U.S. Cl.
CPC ............... *C30B 33/02* (2013.01); *C22F 1/00* (2013.01); *C30B 35/002* (2013.01);
(Continued)

(58) Field of Classification Search
None
See application file for complete search history.

(56) References Cited

U.S. PATENT DOCUMENTS

2009/0098004 A1* 4/2009 Gardin ................. B30B 11/001
419/1
2012/0100032 A1* 4/2012 Voice .................... B22F 3/1291
419/49
(Continued)

FOREIGN PATENT DOCUMENTS

CN 107931613 A 4/2018

OTHER PUBLICATIONS

May 30, 2019 Search Report issued in Great Britain Patent Application No. 1901610.4.

*Primary Examiner* — George Wyszomierski
(74) *Attorney, Agent, or Firm* — Oliff PLC

(57) ABSTRACT

An insert fixture has a base, a plurality of mounting brackets, and a plurality of separators. The plurality of separators extends vertically from the base and includes a plurality of grid portions extending the length of the insert fixture and a plurality of divider portions, which connect to the plurality of grid portions to form a plurality of individual component holders around one of the plurality of mounting brackets. Each individual component holder has two separated grid portion sections positioned on either side of the bracket. These grid portions have two divider portions which are also separated and positioned either side of the bracket at an angle relative to the two grid portions. The individual component holder forms a cell around the mounting bracket. The insert fixture may be constructed from a molybdenum alloy, lanthanum oxide and/or titanium zirconium molybdenum.

10 Claims, 3 Drawing Sheets

(51) Int. Cl.
*C22F 1/00* (2006.01)
*C30B 29/52* (2006.01)
*C30B 1/12* (2006.01)
*B22F 3/15* (2006.01)

(52) U.S. Cl.
CPC .......... *B22F 2003/153* (2013.01); *C30B 1/12* (2013.01); *C30B 29/52* (2013.01)

(56) References Cited

U.S. PATENT DOCUMENTS

2015/0232959 A1 8/2015 Walters et al.
2020/0139439 A1* 5/2020 John .................. B33Y 10/00

* cited by examiner

INSERT FOR HOT ISOSTATIC PRESSING TREATMENT

CROSS-REFERENCE TO RELATED APPLICATIONS

This specification is based upon and claims the benefit of priority from United Kingdom patent application number GB 1901610.4 filed on Feb. 6, 2019, the entire contents of which are incorporated herein by reference.

BACKGROUND

Field of the Disclosure

The present disclosure concerns an insert for supporting components during hot isostatic pressing (HIP).

Description of the Related Art

Turbine blades and vanes used in gas turbine engines can be manufactured as single crystal structures. The materials for these are typically nickel or cobalt based superalloys, which can be cast to form the desired shape with a single crystal structure. The use of such materials allows the blades to withstand the forces and temperatures in the engine for prolonged periods of time. An issue, however, arises with the casting process in that micro-voids can be formed in the crystal blades. When the blades are in operation repeated exposure to the thermal and operational conditions of the engine can result in creep, which is a deformation of an area of the blade resulting from the strain and temperature which the components are under. Any creep around the micro-void regions can be greater than in the surrounding areas, and as such can lead to cracks within the component.

After casting the single crystal blades are subjected to a HIP treatment to improve the creep resistance; this technique is used as it removes the micro-voids within the structure. To carry out the HIP treatment, the blades are placed in a basket before being sealed into a containment vessel. Once in the containment vessel the blades are subjected to both high temperatures and high isostatic gas pressure. This treatment process is performed with the blades being randomly distributed in the basket before the vessel is sealed. This random distribution of blades, however, can lead to some of the blades being positioned poorly and even touching neighbouring blades or the basket. This contact between the components is one of the issues of the current HIP treatment, as any point of contact on the blades leads to localised damage resulting from re-crystallisation in the area where contact was present. This damaged region means that some of the blades have to be reworked or scrapped. As a result there is a need to overcome these losses and/or to produce a more efficient means of treating the blades and at least to provide a useful alternative insert.

SUMMARY OF THE DISCLOSURE

According to a first aspect there is provided an insert fixture for use in the manufacture of a single crystal component by a hot isostatic pressing process, the insert fixture comprising: a base, a plurality of mounting brackets, and a plurality of separators; wherein the plurality of separators extend vertically from the base and include a plurality of grid portions extending the length of the insert fixture and a plurality of divider portions, which connect to the plurality of grid portions to form a plurality of individual component holders around one of the plurality of mounting brackets; and each individual component holder comprises two separated grid portion sections positioned on either side of the bracket, these grid portions having two divider portions which are also separated and positioned either side of the bracket at an angle relative to the two gird portions so that the individual component holder forms a cell around the mounting bracket.

It has been found that placing the blades within the insert fixture can remove any contact between the single crystal components. This reduces the amount of damage to the blades due to recrystallisation of the contact regions. This reduces the need for blade scrappage and reworking that is required. It also means that all the components are subjected to equal processing conditions, so the reproducibility between batches is maintained, thus providing a more reliable treatment method.

The insert fixture may be constructed from one or more of a molybdenum lanthanum oxide and/or titanium zirconium molybdenum.

The insert fixture may then be coated with aluminium oxide.

The plurality of grid portions and the plurality of divider portions of the insert fixture may interconnect via slot and tab coupling.

Apertures may be formed in the plurality of grid portions and the plurality of divider portions to allow gas flow through the basket.

At least one of either the grid portions or the divider portions may extend a greater vertical distance from the base than the component extends from the base.

The plurality of grid portions and/or the plurality of divider portions may be cut from a sheet using a laser.

The grid portions and divider portions may be riveted together.

The insert fixture may be used to support single crystal components that are parts of a gas turbine engine.

The single crystal components that are supported by the insert fixture may be turbine blades.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

BRIEF DESCRIPTION OF THE DRAWINGS

Embodiments will now be described by way of example only, with reference to the Figures, in which.

DETAILED DESCRIPTION OF THE DISCLOSURE

Figure 1:
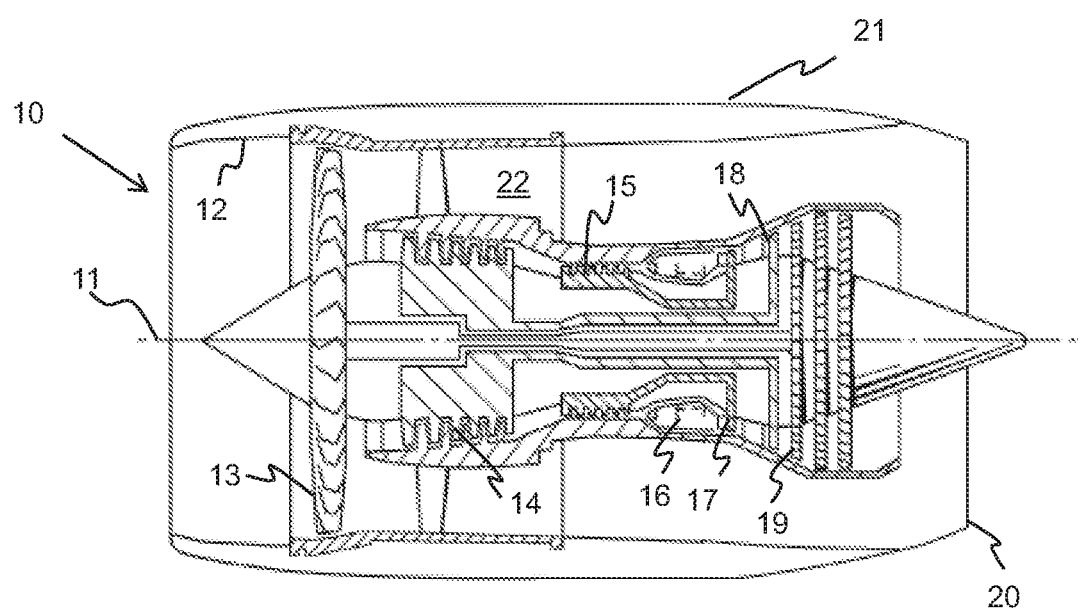
FIG. 1 is a sectional side view of a gas turbine engine.

With reference to FIG. 1, a gas turbine engine is generally indicated at 10, having a principal and rotational axis 11. The engine 10 comprises, in axial flow series, an air intake 12, a propulsive fan 13, an intermediate pressure compressor 14, a high-pressure compressor 15, combustion equipment 16, a high-pressure turbine 17, an intermediate pressure turbine 18, a low-pressure turbine 19 and an exhaust nozzle 20. A nacelle 21 generally surrounds the engine 10 and defines both the intake 12 and the exhaust nozzle 20.

The gas turbine engine 10 works in the conventional manner so that air entering the intake 12 is accelerated by the fan 13 to produce two air flows: a first air flow into the intermediate pressure compressor 14 and a second air flow which passes through a bypass duct 22 to provide propulsive thrust. The intermediate pressure compressor 14 compresses the air flow directed into it before delivering that air to the high pressure compressor 15 where further compression takes place.

The compressed air exhausted from the high-pressure compressor 15 is directed into the combustion equipment 16 where it is mixed with fuel and the mixture combusted. The resultant hot combustion products then expand through, and thereby drive the high, intermediate and low-pressure turbines 17, 18, 19 before being exhausted through the nozzle 20 to provide additional propulsive thrust. The high 17, intermediate 18 and low 19 pressure turbines drive respectively the high pressure compressor 15, intermediate pressure compressor 14 and fan 13, each by suitable interconnecting shaft.

Other gas turbine engines to which the present disclosure may be applied may have alternative configurations. By way of example such engines may have an alternative number of interconnecting shafts (e.g. two) and/or an alternative number of compressors and/or turbines. Further the engine may comprise a gearbox provided in the drive train from a turbine to a compressor and/or fan.

In the HIP process, a number of baskets are typically used to support the components within the pressure vessel. Each basket can be of a rivet design, featuring a cylindrical outer wall and inner internal support structure. Coupled to these is a base plate that is provided with a series of holes to allow the gas to flow between the different baskets. The baskets are then stacked in any suitable configuration before being inserted into the HIP chamber. This could be for example 1, 2, 3, 4, 5, 6, 7 or greater number of baskets stacked on top of each other. Each basket is also provided with a number of thermocouples to monitor the temperature conditions inside each basket.

Figure 2:
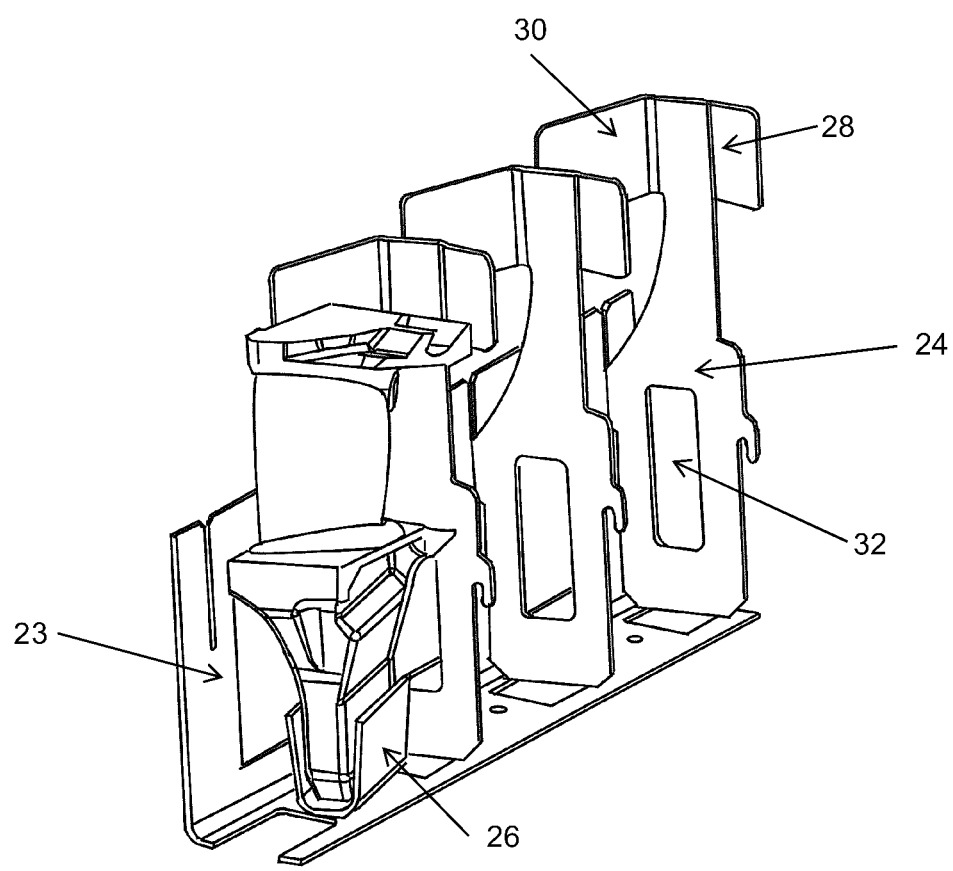
FIG. 2 is a sectional view of a portion of the insert fixture for HIP treatment of the present disclosure.
Figure 3:
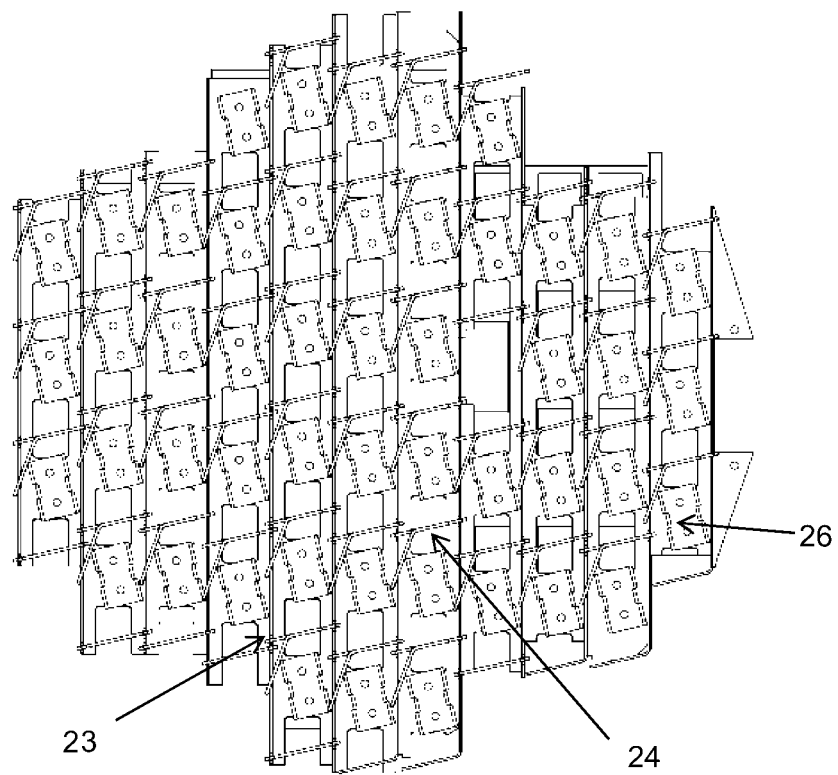
FIG. 3 is a plan view of the insert, of which a subsection is shown in FIG. 2, for HIP treatment of the present disclosure.

The insert for placing in a HIP processing basket, is shown in FIG. 2 comprises a series of interlocking sheets comprising grid portions 23 and divider portions 24 and a base supporting a bracket 26 designed to support the blade at its root. This bracket allows the blade to extend vertically in the inset, with each blade being positioned in its own cell. The brackets are used to locate the blade and to fix its orientation. The brackets are constructed to be slightly wider than the root, so that insertion of the blades is simplified. The base clips or brackets 26 can be "u" shaped components that are connected to either or both of a grid portion section or a base section, so that the bracket is stable and the components are not prone to movement during processing. Each section of the insert is formed from four walls defining a cell with the walls being spaced apart from the blade when it is positioned within them. The walls themselves are constructed of series of parallel longitudinally extending grid portions 23—extending across the entire width of the insert at that point—connected to a series of divider portions 24, which are angled relative to the grid portions to form a cell around a bracket. Connection of grid portions and the divider portions may be performed through the use of tabs on the dividers that engage with slots on the grid pieces. Alternatively, the components could be welded or brazed together. Another option is for the portions to be supplied with holes through which fastening means such as bolts may be inserted. The combination of the grid portions and divider portions can be configured such that, apart from the extreme grid portions, the use of two divider portions allows for a grid portion to be connected with its neighbouring grid portions on either side for each cell of the insert. This is shown in the plan view in FIG. 3. The divider portions 24 may be designed to extend to a greater height than the grid portions 23. The grid portions or the dividers may extend to at least the height of the component when it is mounted within the insert fixture, wherein the height is the vertical distance from the base of the component in the insert fixture to its tip. The divider portions may also be provided with a double flagpole configuration, such that tabs 28, 30 on the upper part of the plane of the divider are angled with respect to the divider so as to prevent contact between neighbouring turbine blades. These so called "flags" can be angled so as to match the shape of the tip of the blade.

The insert fixture may be constructed out of shaped sheets that are designed to interlock. The fixture may be constructed from titanium zirconium molybdenum and/or molybdenum lanthanum oxide. The fixture may be coated in aluminium oxide. The insert may be configured such that it can only be positioned in the HIP basket one way, thus leading to greater conformity between the parts and between different batches of processed components. The walls of the dividers and grids may be provided with holes or cut away sections shown as 32 in FIG. 2 to allow gas to flow through the grids. In order to cut the sheets into their intricate shapes, laser cutting may be used. Alternatively other suitable manufacturing techniques such as 3D printing or computer aided manufacture processing may be employed. The sheets may also be securely connected to each other through the use of rivets. Therefore, this modular design allows for reuse and means that some components can be replaced if they become damaged. The angled flagpoles can be formed using press bake manufacturing to ensure a high degree of conformity between the divider and the profile of the blade tip.

In processing the insert is positioned into the HIP basket before the blades are loaded into each cell. As the insert may only have a single orientation for insertion into the basket, it means that the processing conditions on each blade can be reproduced between batches. Once the insert has been filled with the blades the basket can then be loaded onto the others in the vessel and sealed. The HIP processing is then carried out in an argon atmosphere, and the relative openness of the cells allows the gas to pass to all of the blades in an unrestricted way. This process removes the microvoids formed during the production of the single crystal blades and thus reduces the requirements to scrap or rework these damaged blades.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

We claim:

1. An insert fixture for use in the manufacture of a single crystal component by a hot isostatic pressing process, the insert fixture comprising: a base, a plurality of mounting brackets, and a plurality of separators;

wherein the plurality of separators extend vertically from the base and include a plurality of grid portions extending the length of the insert fixture and a plurality of divider portions, which connect to the plurality of grid portions to form a plurality of individual component holders around one of the plurality of mounting brackets; and each individual component holder comprises two separated grid portion sections positioned on either side of the bracket, these grid portions having two divider portions which are also separated and positioned either side of the bracket at an angle relative to the two grid portions so that the individual component holder forms a cell around the mounting bracket.

2. The insert fixture as claimed in claim 1 wherein the base, the plurality of mounting brackets and the plurality of separators are constructed from one or more of molybdenum lanthanum oxide and/or titanium zirconium molybdenum.

3. The insert fixture as claimed in claim 1, wherein the insert fixture is coated with aluminium oxide.

4. The insert fixture according to claim 1, wherein the plurality of grid portions and the plurality of divider portions of the insert fixture interconnect via slot and tab coupling.

5. The insert fixture as claimed in claim 4 wherein apertures are formed in the plurality of grid portions and the plurality of divider portions to allow gas flow through a basket.

6. The insert fixture as claimed claim 1, wherein at least one of either the grid portions or the divider portions extends a greater vertical distance from the base than the component extends from the base.

7. The insert fixture as claimed in claim 1, wherein the plurality of grid portions and/or the plurality of divider portions are cut from a sheet using a laser.

8. The insert fixture as claimed in claim 1, wherein the grid portions and divider portions are riveted together.

9. The insert fixture as claimed in claim 1, wherein the single crystal components are parts of a gas turbine engine.

10. The insert fixture as claimed in claim 9, wherein the single crystal components are turbine blades.

* * * * *